(12) United States Patent
Lee

(10) Patent No.: US 7,781,867 B2
(45) Date of Patent: Aug. 24, 2010

(54) METHOD AND SYSTEM FOR PROVIDING AN ALIGNED SEMICONDUCTOR ASSEMBLY

(75) Inventor: Michael G. Lee, San Jose, CA (US)

(73) Assignee: Fujitsu Limited, Kawasaki (JP)

( * ) Notice: Subject to any disclaimer, the term of this patent is extended or adjusted under 35 U.S.C. 154(b) by 118 days.

(21) Appl. No.: 11/966,254

(22) Filed: Dec. 28, 2007

(65) Prior Publication Data

US 2009/0166857 A1 Jul. 2, 2009

(51) Int. Cl.
*H01L 29/06* (2006.01)
(52) U.S. Cl. .......................... 257/618; 257/777; 257/778
(58) Field of Classification Search ................ 257/618, 257/734, 737, 777, 778, 685, 686, 697, 798, 257/785, E23.023, E21.505
See application file for complete search history.

(56) References Cited

U.S. PATENT DOCUMENTS

| | | | | |
|---|---|---|---|---|
| 4,750,092 | A * | 6/1988 | Werther | 361/783 |
| 4,878,611 | A * | 11/1989 | LoVasco et al. | 228/180.22 |
| 5,528,462 | A * | 6/1996 | Pendse | 361/767 |
| 5,834,335 | A * | 11/1998 | Buschbom | 438/107 |
| 6,611,635 | B1 | 8/2003 | Yoshimura et al. | 385/14 |
| 6,684,007 | B2 | 1/2004 | Yoshimura et al. | 385/31 |
| 6,690,845 | B1 | 2/2004 | Inao et al. | 385/14 |
| 6,743,026 | B1 * | 6/2004 | Brodsky | 439/73 |
| 6,834,133 | B1 | 12/2004 | Towle et al. | 385/14 |
| 6,907,151 | B2 | 6/2005 | Yunus | 385/14 |
| 6,924,556 | B2 * | 8/2005 | Cha | 257/777 |
| 6,978,539 | B2 * | 12/2005 | Kung et al. | 29/832 |
| 7,092,603 | B2 | 8/2006 | Glebov et al. | 385/51 |
| 7,310,457 | B2 | 12/2007 | Kotake | 385/14 |
| 7,343,058 | B2 | 3/2008 | Block et al. | 385/14 |
| 7,418,165 | B2 | 8/2008 | Glebov et al. | 385/14 |
| 7,486,847 | B1 | 2/2009 | Dellmann et al. | 385/14 |
| 2003/0219213 | A1 * | 11/2003 | Blarasin et al. | 385/52 |
| 2004/0248391 | A1 * | 12/2004 | Elyaakoubi et al. | 438/578 |
| 2005/0207693 | A1 | 9/2005 | Yokouchi | 385/14 |
| 2006/0208165 | A1 | 9/2006 | Lee et al. | 250/214 |
| 2006/0209519 | A1 | 9/2006 | Bakir et al. | 361/772 |

OTHER PUBLICATIONS

Optical lithography: Introduction by G.L. -T. Chiu and J.M. Shaw; IBM J. Res. Develop. vol. 41, No. 1/2; 4 pages, Jan./Mar. 1997.
Flip Chips Dot Com; Tutorial 1—Oct. 2000; Introduction to Flip Chip: What, Why, How; George A. Riley, FlipChips.com; http://www.flipchips.com/tutorial01.html; 7 pages.

(Continued)

*Primary Examiner*—Leonardo Andújar
*Assistant Examiner*—Jordan Klein
(74) *Attorney, Agent, or Firm*—Baker Botts L.L.P.

(57) ABSTRACT

A semiconductor assembly is provided that includes a first substrate that has a first surface. A second substrate is coupled to and spaced apart from the first substrate. The second substrate has a second surface facing the first surface of the first substrate. The second substrate includes a set of cavities. A set of non-conductive pillars is disposed on and protrudes from the first surface of the first substrate. The set of non-conductive pillars is configured and positioned to engage the set of cavities of the second substrate to align the second substrate with the first substrate.

12 Claims, 7 Drawing Sheets

OTHER PUBLICATIONS

Flip Chips Dot Corn; Tutorial 2—Nov. 2000; Solder Bump Flip Chip; http://www.flipchips.com/tutorial02a.html; 10 pages.
United States Office Action; U.S. Appl. No. 12/186,020; pp. 18, Apr. 2, 2009.
United States Office Action; U.S. Appl. No. 12/186,020; pp. 12 Nov. 17, 2009.

* cited by examiner

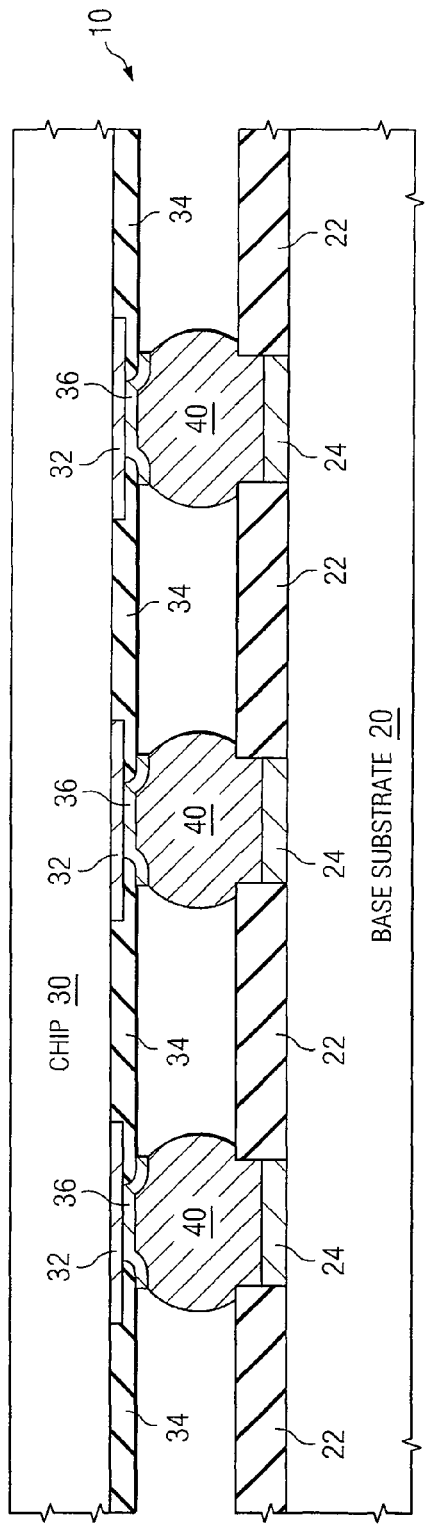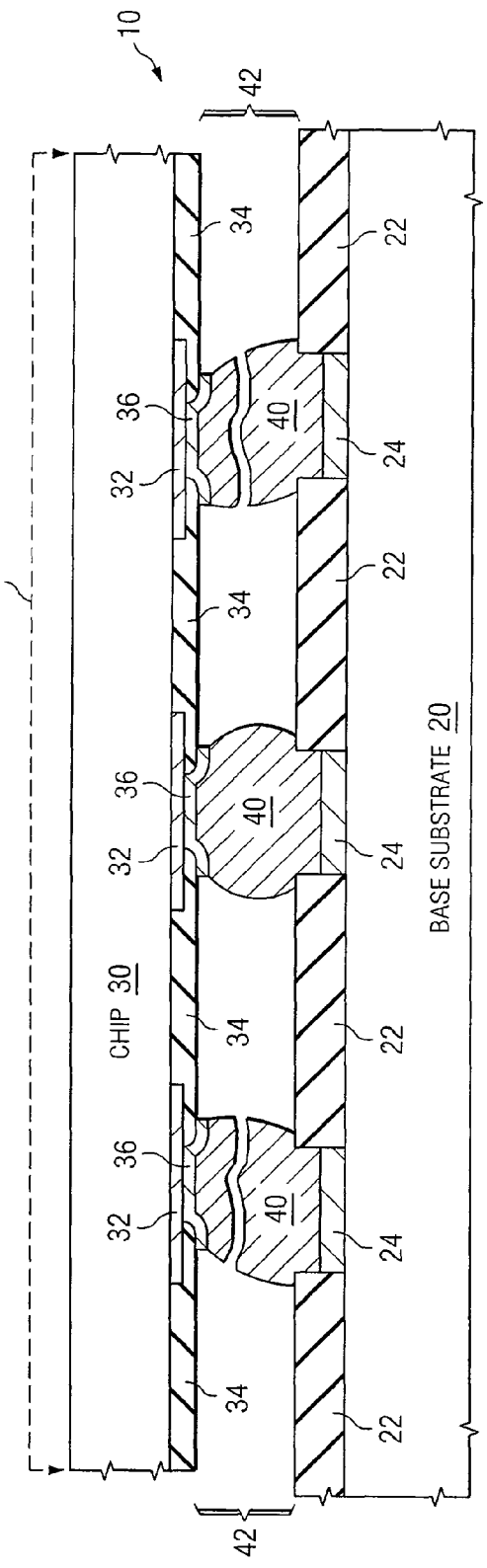

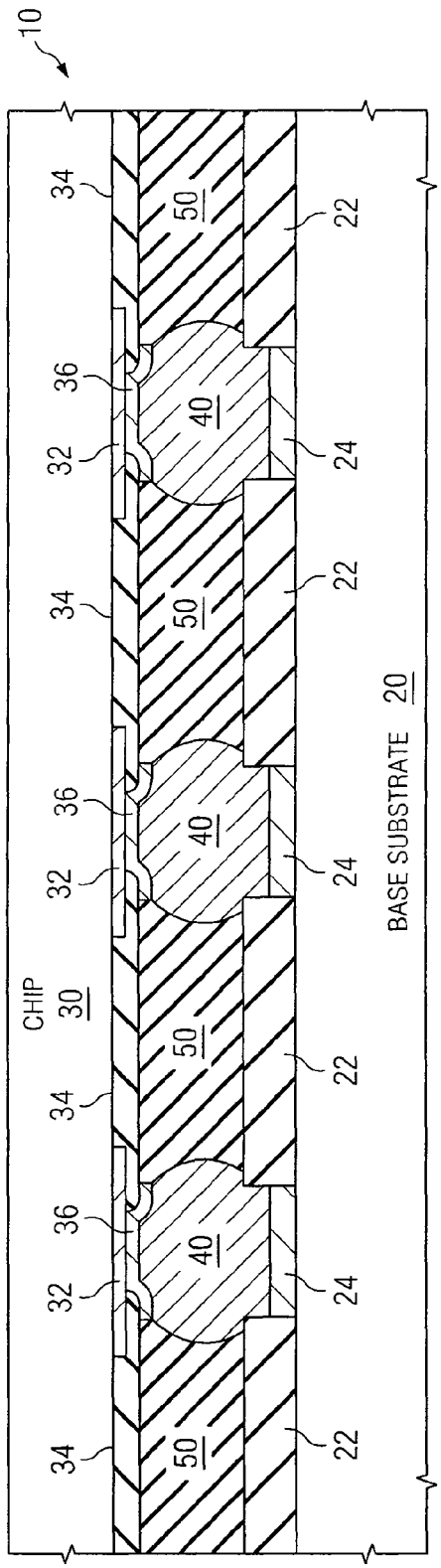
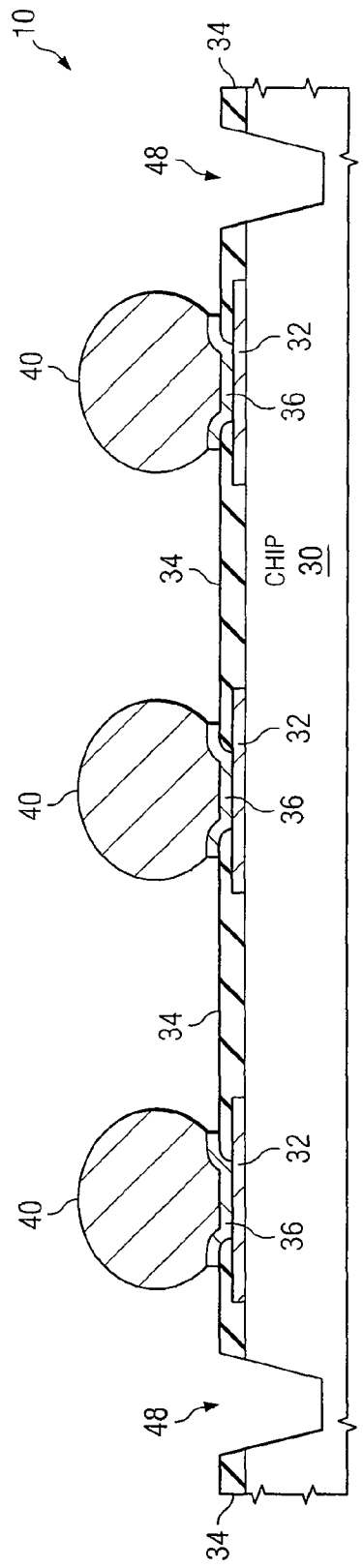

METHOD AND SYSTEM FOR PROVIDING AN ALIGNED SEMICONDUCTOR ASSEMBLY

TECHNICAL FIELD

This invention relates generally to semiconductors and, more particularly, to a method and system for providing an aligned semiconductor assembly.

BACKGROUND

Low-profile semiconductor assemblies are in high demand. In response to the high demand, semiconductor assemblies have been developed that include chips coupled to substrates using low-profile interconnections. For example, the low-profile interconnections may comprise solder bumps that provide an electric path between the chip and the substrate.

However, the solder bumps may suffer from stress caused by relative movement between the chip and base substrate. As a result, the solder bumps and assembly may suffer from reliability problems. For example, the substrate and the chip may have a different coefficient of thermal expansion (CTE). The stress caused by the different CTEs may cause the solder bumps to crack. A material referred to as underfill may be applied between the chip and the substrate to reinforce the mechanical strength of the assembly. However, it may be difficult to apply underfill material between the chip and the substrate, especially in low-profile semiconductor assemblies where chips are vertically stacked.

SUMMARY OF THE DISCLOSURE

The present invention provides a method and system for providing an aligned semiconductor assembly that substantially eliminates or reduces at least some of the disadvantages and problems associated with previous methods and systems.

According to one embodiment of the present invention, a semiconductor assembly is provided that includes a first substrate that has a first surface. A second substrate is coupled to and spaced apart from the first substrate. The second substrate has a second surface facing the first surface of the first substrate. The second substrate includes a set of cavities. A set of non-conductive pillars is disposed on and protrudes from the first surface of the first substrate. The set of non-conductive pillars is configured and positioned to engage the set of cavities of the second substrate to align the second substrate with the first substrate.

Certain embodiments of the invention may provide one or more technical advantages. A technical advantage of one embodiment may include pillars on a base substrate that engage cavities in a chip to align the base substrate with the chip. The pillars also restrict movement caused by, for example, the differences in the coefficients of thermal expansion (CTE) of the chip and base substrate. Thus, reliable solder bumps with a low profile may be applied to the assembly without requiring underfill to reinforce the solder bumps.

Another technical advantage of one embodiment may include an adhesive that is applied to the cavities on the chip to bond the pillars to the cavities on the chip. In this embodiment, bonded pillars may restrict not only lateral movement but also vertical movement.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which:

FIG. 1A is a diagram illustrating an example semiconductor assembly;

FIG. 1B is a diagram illustrating an example of the results of stress to the assembly of FIG. 1A;

FIG. 1C is a diagram illustrating an underfill material applied to the assembly of FIG. 1A;

FIG. 2A is a diagram illustrating the chip of FIG. 1A with cavities on the surface of the chip, in accordance with one embodiment of the present invention;

DETAILED DESCRIPTION OF THE DRAWINGS

Figure 2B:
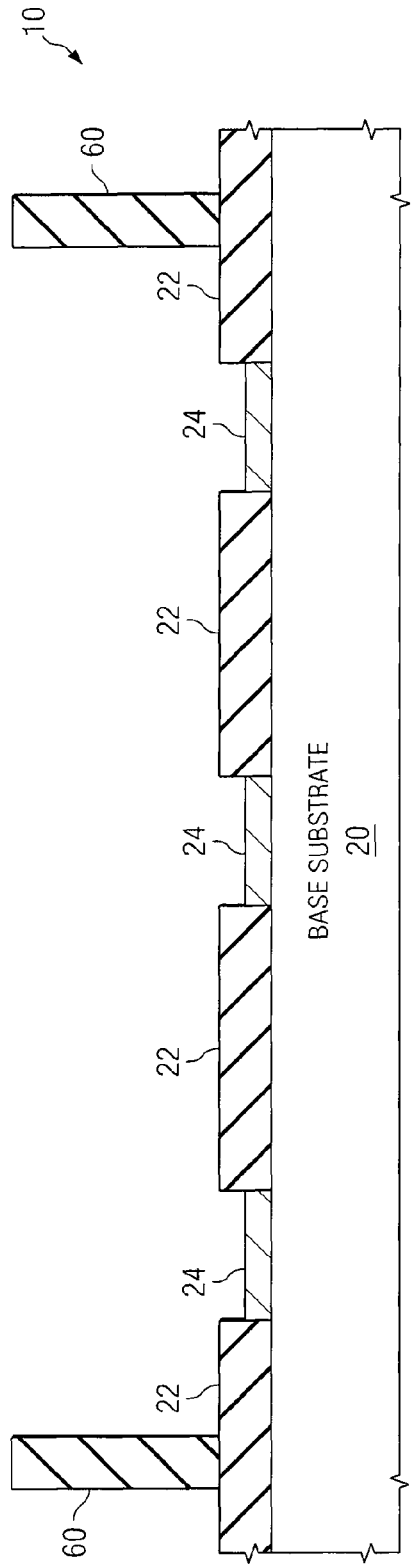
FIG. 2B is a diagram illustrating the base substrate of FIG. 1A with pillars disposed on the surface of the base substrate, in accordance with one embodiment of the present invention.

Embodiments of the present invention and its advantages are best understood by referring to FIGS. 1-5 of the drawings, like numerals being used for like and corresponding parts of the various drawings.

FIG. 1A is a diagram illustrating an example semiconductor assembly 10. Semiconductor assemblies, such as assembly 10, are devices in which one or more semiconductor chips (e.g., integrated circuits) are coupled to a base substrate. The base substrate may be used to couple a chip to other components on or external to the substrate. Typically, to couple the chip to the substrate, solder bumps are applied to the surface of the chip. The chip and the applied solder bumps are aligned over the base substrate, such that each solder bump at least partially fills a bump pad on the base substrate, and such that the chip is spaced apart from the base substrate by a gap. Underfill material may be applied in the gap between the chip and the base substrate to reinforce the mechanical strength of the assembly. However, if the gap height between the chip and the substrate is small, it is difficult to apply underfill material between the chip and the substrate, especially in assemblies with chips that are vertically stacked.

As described in more detail below, a set of one or more pillars are disposed on the base substrate to engage cavities on the chip to align the base substrate and the chip. According to one embodiment, the set of one or more pillars may be disposed on the chip to engage cavities on the base substrate to align the base substrate and the chip. Alignment, as it is referred to in this disclosure, refers to aligning the chip with the base substrate during coupling and restricting relative movement between the chip and base substrate after coupling, such as upon thermal expansion or contraction. Restricting movement may include preventing and/or restraining movement, such as upon thermal expansion or contraction. This helps to reduce the amount of stress at the solder bumps and improves the reliability of the solder bumps and assembly.

As shown in FIG. 1A, assembly 10 includes a base substrate 20 and a chip 30. Base substrate 20 is coupled to chip 30 by one or more solder bumps 40. It should be noted that although selected components of assembly 10 are illustrated in FIGS. 1A-1C at a high level, other materials and coupling techniques might be used. Moreover, assembly 10 may include any other well-known components and the techniques described herein may be applied to many varieties of semiconductor assemblies such as chip on chip, chip on substrate, electro-optic component on chip, and micro-electro-mechanical systems (MEMS) on chip, for example.

Base substrate 20 may comprise any suitable surface and may comprise any suitable ceramic or organic material. For example, base substrate 20 may comprise a plastic surface mount for chip 30 (also referred to as a package). As another example, base substrate 20 may comprise a second semiconductor chip that also acts as a base substrate for chip 30. In the illustrated embodiment, base substrate 20 includes a solder mask 22 that defines an opening for bump pads 24. Bump pads 24 connect to circuitry within base substrate 20 that allows base substrate 20 to electrically (or otherwise) couple chip 30 with an external device or with one or more other components coupled to base substrate 20. Solder mask 22 may comprise any suitable non-conductive material such as polymer, for example. Bump pads 24 may comprise any suitable conductive material such as copper, for example.

Chip 30 may comprise any suitable device operable to perform data transmission. For example, chip 30 may perform data transmission using electric signals. Chip 30 may refer to a silicon chip, microelectronic chip, optoelectronic chip, MEMS chip, microchip die, integrated circuit, or any other suitable data transmission device. Chip 30 may be coupled to base substrate 20 by any suitable technique, such as by flip-chip coupling, for example.

Chip 30 includes contact pads 32 that provide input/output (I/O) to chip 30. Contact pads 32 may comprise any suitable conductive material such as copper, for example. Chip 30 may also includes a passivation layer 34 that provides a contamination protection layer for chip 30. Passivation layer 34 may comprise any suitable layer of material such as dielectric material, for example. Chip 30 may further include under bump metallurgy (UBM) layers 36 that assist in coupling chip 30 to solder bumps 40. UBM layer 36 may comprise any suitable conductive material such as nickel, for example.

Solder bumps 40 may comprise any suitable material operable to interconnect chip 30 and substrate 20. According to various embodiments, solder bumps 40 may comprise any suitable conductive material such as gold, tin, lead, or copper, for example. According to other embodiments, solder bumps 40 may be replaced by other types of interconnections such as microelectronic interconnections, optical interconnections, or any other suitable interconnections. As described in more detail below, solder bumps 40 may suffer from stress reducing the reliability of solder bumps 40 and assembly 10.

FIG. 1B is a diagram illustrating an example of the results of stress to semiconductor assembly 10 of FIG. 1A. Assembly 10 may suffer from stress caused by relative movement between chip 30 and base substrate 20. As a result, solder bumps 40 may suffer from cracks, as shown in FIG. 1B. For example, chip 30 may contract and move with respect to base substrate 20, as indicated by reference number 44 in FIG. 1B, thereby causing stress to solder bumps 40 in a gap 42.

FIG. 1C is a diagram illustrating an underfill material 50 applied to semiconductor assembly 10 of FIG. 1A. Underfill 50 may be applied between the chip and the base substrate 20 to reinforce the mechanical strength of solder bumps 40. Underfill 50 may comprise a flux material mixed with any suitable organic material, such as an epoxy, for example.

However, it may be difficult to introduce underfill 50 in the gap between chip 30 and base substrate 20 because the gap may be too small and the composition of underfill 50 may have a high viscosity. Yet a small gap between chip 30 and base substrate 20 is highly desirable in order to achieve short wiring lengths and high interconnect densities in assembly 10.

Particular embodiments of the present invention provide "pillars" to increase the structural integrity of assembly 10 and thereby improve the reliability of solder bumps 40 and assembly 10 without requiring underfill 50. For example, the pillars may comprise non-conductive protrusions disposed on base substrate 20. The pillars are configured and positioned to engage cavities formed in chip 30 to align base substrate 20 and chip 30. According to one embodiment, The pillars may be configured and positioned to engage cavities formed in base substrate 20 to align base substrate 20 and chip 30. Aligning chip 30 and base substrate 20 reduces the amount of stress at solder bumps 40 and improves the reliability of solder bumps 40 and assembly 10. A better understanding of particular embodiments of the present invention is provided below with reference to FIGS. 2A and 2B.

Figure 4A:
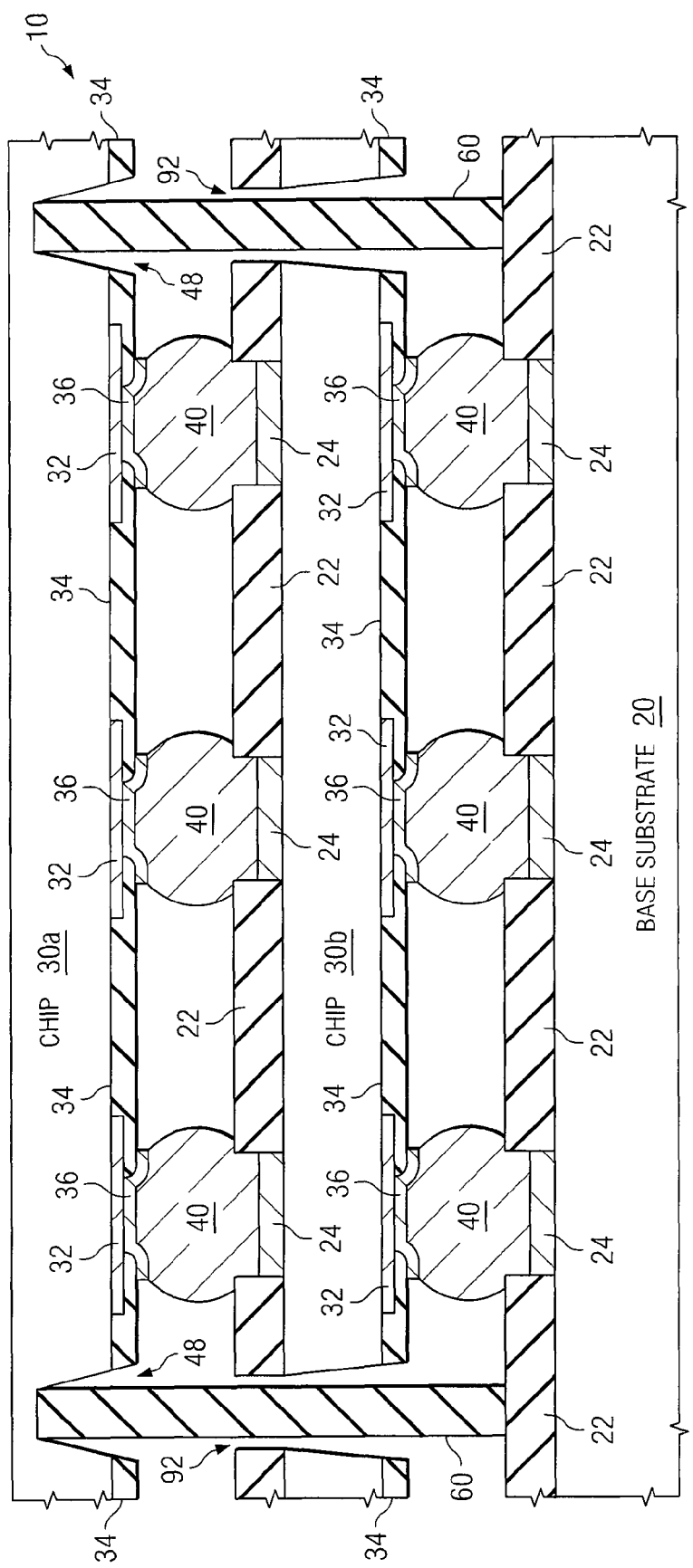
FIG. 4A is a diagram illustrating two stacked chips coupled with the base substrate of FIG. 2B, in accordance with one embodiment of the present invention.
Figure 4B:
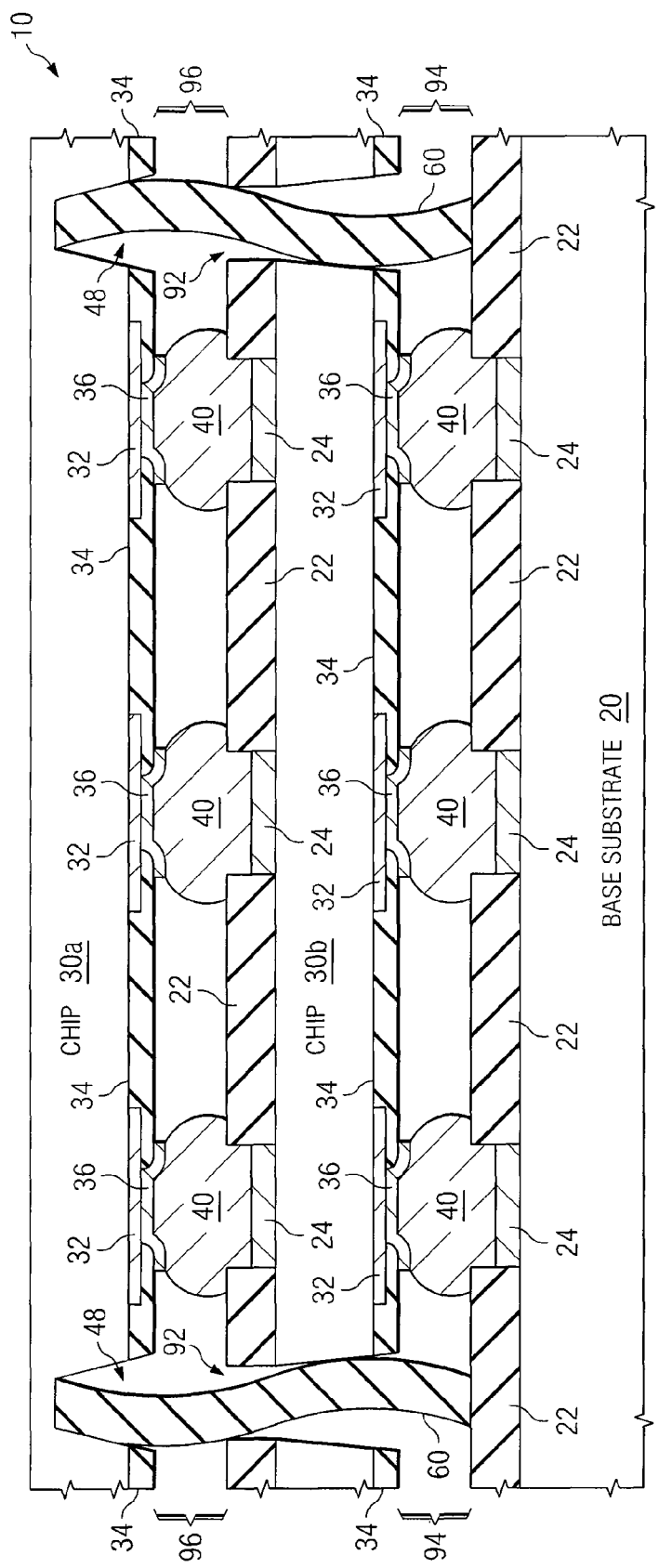
FIG. 4B is a diagram illustrating pillars restricting the movement of the assembly of FIG. 4A, in accordance with one embodiment of the present invention.

FIG. 2A is a diagram illustrating chip 30 of FIG. 1A with cavities 48 on the surface of chip 30, in accordance with one embodiment of the present invention. As described in more detail below, cavities 48 may comprise any suitable opening such as depressions as shown in FIG. 2A, or vias as shown in FIGS. 4A and 4B. According to these embodiments, cavities 48 may have any suitable dimension such that openings of cavities 48 are larger than the corresponding pillars. In the illustrated embodiment, cavities 48 are tapered downward in order to facilitate engagement with the pillars. According to one embodiment, the tapered cavities may be produced by any suitable technique such as directional photolithography, silicon anisotropic etching, or gray-scale lithography. For example, in silicon anisotropic etching, a potassium hydroxide solution may create a 54.7-degree sidewall slope. However, the present disclosure contemplates many different techniques for forming shapes of cavities 48. Various embodiments may include, some, all, or none of the enumerated techniques and shapes.

FIG. 2B is a diagram illustrating the base substrate of FIG. 1A with pillars 60 disposed on the surface of base substrate 20, in accordance with one embodiment of the present invention According to the embodiment, pillars 60 may comprise non-conductive protrusions extending from base substrate 20. According to one embodiment, pillars 60 may extend from chip 30. Pillars 60 may be disposed in any suitable location such as pre-determined locations at four corners of base substrate 20, for example.

According to one embodiment of the present invention, pillars 60 may comprise a deformable material such as a polymer, photo-epoxy, or polysiloxane-based material, for example. Pillars 60 may have any suitable shape and dimensions, such as a cuboid that is 10 um in width and 100 um in height, for example. According to one embodiment of the invention, pillars 60 may facilitate active optical alignment. For example, chip 30 may have an optical sensor to improve alignment with base substrate 20. Pillars 60 may transmit light to the optical sensor and therefore pillars 60 may facilitate the optical alignment of chip 30 with base substrate 20.

Moreover, although the illustrated embodiments show pillars 60 with a rectangular cross-section, pillars 60 may have any suitable shape, such as a rounded, square, triangular, or polygonal cross-section. Indeed, the present disclosure contemplates many different shapes and compositions of pillars 60. Various embodiments may include, some, all, or none of the enumerated shapes and compositions.

According to one embodiment of the invention, pillars 60 may be formed by photolithography. For example, a resist material may be deposited on top of solder mask 22 such that solder mask 22 is completely covered. The resist material is then etched to leave protrusions formed on the surface of base substrate 20 that comprise pillars 60.

According to another embodiment, pillars 60 may be disposed on a surface of base substrate 20 by bonding each pillar 60 to the surface with an epoxy, solder, or any other similar material. However, the present disclosure contemplates many types of techniques for disposing pillars 60 on base substrate 20. Various embodiments may include, some, all, or none of the enumerated techniques.

Figure 3A:
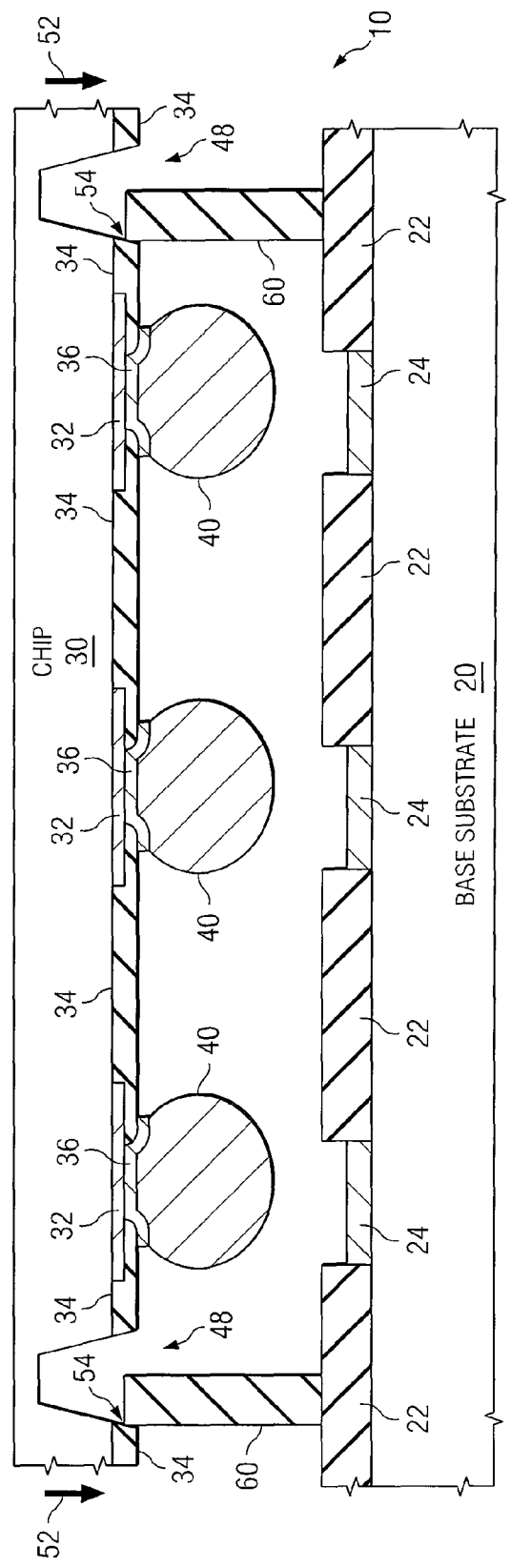
FIG. 3A is a diagram illustrating the pillars of FIG. 2B aligning the chip of FIG. 2A with the base substrate of FIG. 2B, in accordance with one embodiment of the present invention.

FIG. 3A is a diagram illustrating pillars 60 of FIG. 2B aligning chip 30 of FIG. 2A with base substrate 20 of FIG. 2B, in accordance with one embodiment of the present invention. In the illustrated embodiment, solder bumps 40 applied to chip 30 are positioned over base substrate 20, such that each solder bump 40 is positioned over a corresponding bump pad 24 on the surface of base substrate 20, and such that chip 30 is spaced apart from base substrate 20. As chip 30 is coupled to base substrate 20, some degree of misalignment may exist and pillars 60 are configured and positioned to engage cavities 48, as indicated by reference number 54. With a coupling force, as indicated by reference number 52, pillars 60 engage further inside cavities 48, thereby aligning base substrate 20 and chip 30 accordingly. According to one embodiment, pillars 60 may be disposed on chip 30 to engage cavities on base substrate 20 to align base substrate 20 and chip 30. With solder bumps 40 disposed between, and in contact with the chip 30 and bump pads 24, a rigid coupling may be formed between a surface of chip 30 and a facing surface of base substrate 20, as described below with reference to FIG. 3B.

Figure 3B:
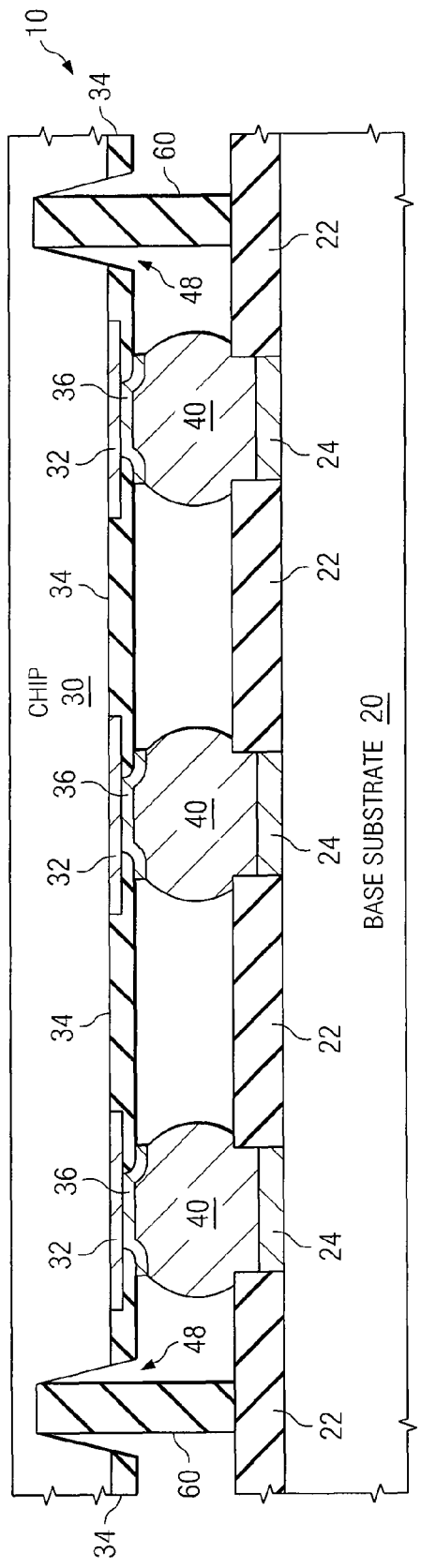
FIG. 3B is a diagram illustrating the chip of FIG. 2A coupled with the base substrate of FIG. 2B, in accordance with one embodiment of the present invention.

FIG. 3B is a diagram illustrating chip 30 of FIG. 2A coupled with base substrate 20 of FIG. 2B, in accordance with one embodiment of the present invention. In the illustrated embodiment, pillars 60 increase the structural integrity of the rigid coupling between chip 30 and base substrate 20. For example, pillars 60 engage cavities 48 to restrict movement as further described below with reference to FIG. 3C.

Figure 3C:
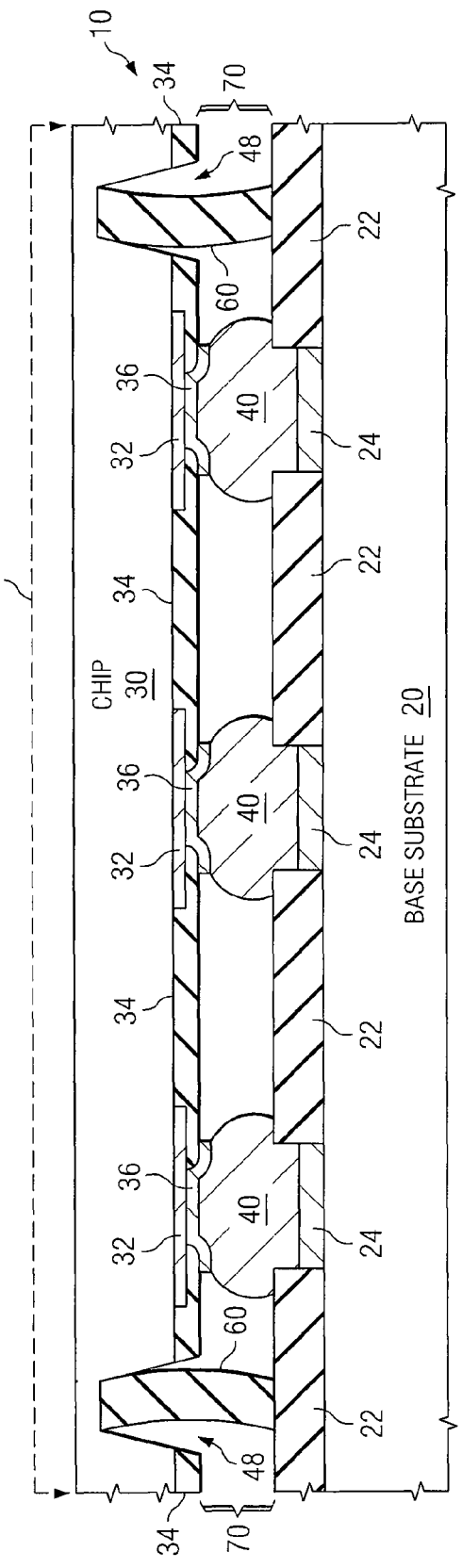
FIG. 3C is a diagram illustrating the pillars of FIG. 2B restricting the movement of the chip of FIG. 2A with respect to the base substrate of FIG. 2B, in accordance with one embodiment of the present invention.

FIG. 3C is a diagram illustrating pillars 60 of FIG. 3B restricting the movement of chip 30 of FIG. 2A with respect to base substrate 20 of FIG. 2B, in accordance with one embodiment of the present invention. In the illustrated embodiment, chip 30 is contracting which is causing movement with respect to base substrate 20, as indicated by reference number 74, and may cause stress to solder bumps 40 in a gap 70. As shown in FIG. 3C, when movement occurs, pillars 60 engage with cavities 48 to restrict movement and align base substrate 20 and chip 30. According to one embodiment of the invention, pillars 60 may be deformable and may deform when engaged, thereby restricting the movement and reducing the stress on solder bumps 40. It should be noted that the deformation illustrated in FIG. 3C may be exaggerated to aid in illustration. In other embodiments, pillars 60 may not deform. Thus, low-profile solder bumps 40 may be applied in assembly 10 without requiring underfill 50 to reinforce solder bumps 40.

Figure 3D:
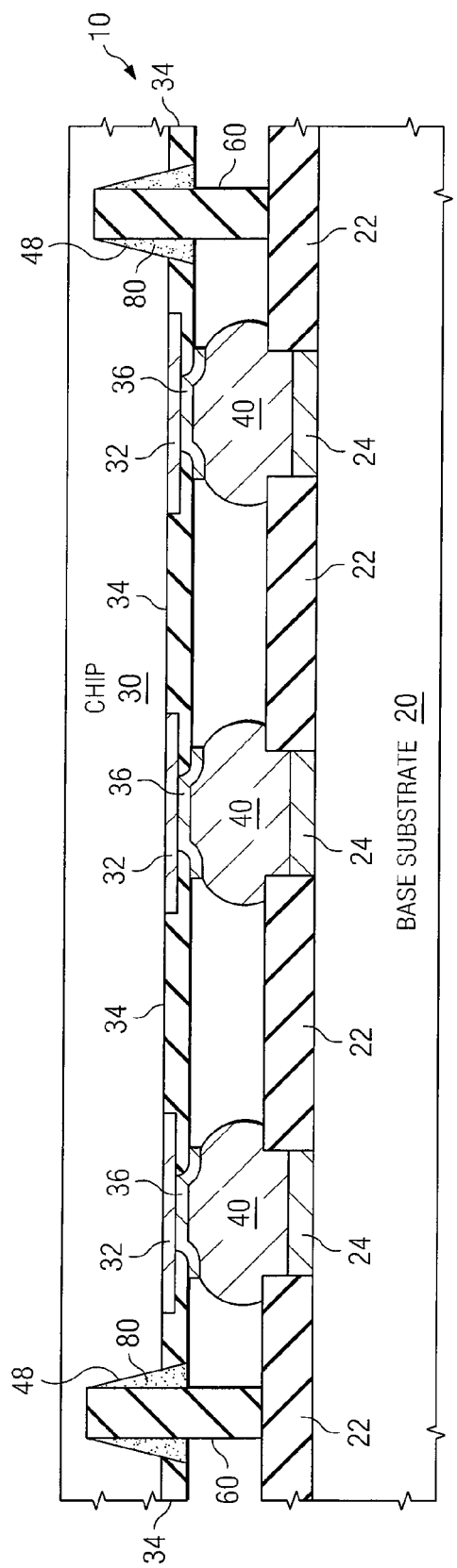
FIG. 3D is a diagram illustrating the pillars of FIG. 2B bonded to the chip of FIG. 2A, in accordance with one embodiment of the present invention.

FIG. 3D is a diagram illustrating pillars 60 of FIG. 2B bonded to chip 30 of FIG. 2A, in accordance with one embodiment of the present invention. In the illustrated embodiment, an adhesive 80 is applied to cavities 48 such that adhesive 80 bonds pillars 60 to restrict relative chip 30 and base substrate 20 from moving apart. Adhesive 80 may comprise an epoxy or any other suitable bonding material. According to another embodiment of the invention, adhesive 80 is applied to pillars 60 by partially immersing pillars 60 in an adhesive dip; however any other suitable techniques may be used.

FIG. 4A is a diagram illustrating two stacked chips 30 coupled with base substrate 20 of FIG. 2B, in accordance with one embodiment of the present invention. Chips 30a and 30b may be substantially similar to chip 30 of FIG. 2A. As shown in the illustrated embodiment, chip 30b has a first surface and a second surface. The first surface of chip 30b includes a solder mask 22 and bump pads 24, and the first surface of chip 30b is coupled to chip 30a. The second surface of chip 30b includes contact pads 32, passivation layers 34, and UBM layers 36. The second surface of 30b is coupled to base substrate 20 as described above.

As shown in the illustrated embodiment, chip 30b includes cavities 92. As described above, cavities may refer to any suitable opening. According to one embodiment of the present invention, cavities 92 of 30b comprise vias and cavities 48 of chip 30a comprise depressions. For example, cavities 92 comprising vias are open throughout chip 30b allowing pillars 60 to extend through cavities 92. Cavities 92 comprising vias can alleviate the requirements for height control and height uniformity of pillars 60. Moreover, pillars 60 are configured and positioned to align and restrict movement for more than one chip 30 by engaging cavities 48 of chip 30a and cavities 92 of chip 30b, as shown in FIG. 4B.

FIG. 4B is a diagram illustrating pillars 60 restricting the movement of assembly 10 of FIG. 4A, in accordance with one embodiment of the present invention. In the illustrated embodiment, chip 30a is contracting causing movement with respect to chip 30b and stress to solder bumps 40 in a gap 96. The contraction is causing movement with respect to base substrate 20 and stress to solder bumps 40 in a gap 94. As shown in FIG. 4B, when movement occurs, pillars 60 engage with cavities 48 and 92 to align base substrate 20 and chips 30a and 30b. According to one embodiment of the invention, pillars 60 may be deformable and may deform when engaged, thereby restricting the movement and reducing the stress on solder bumps 40. It should be noted that the deformation illustrated in FIG. 4B may be exaggerated to aid in illustration. In other embodiments, pillars 60 may not deform.

Thus, example embodiments of the present invention provide an aligned semiconductor assembly. Pillars are configured and positioned to engage cavities to align a chip and a base substrate. In the event of stress induced by, for example, CTE mismatch, the pillars can restrict part of the movement and thereby reduce the stress on solder bumps. Moreover, when the pillars are bonded with adhesive, the reliability may also improve in the event of movement in the vertical direction. Moreover, pillars through vias are configured and positioned to align more than one chip.

Figure 5:
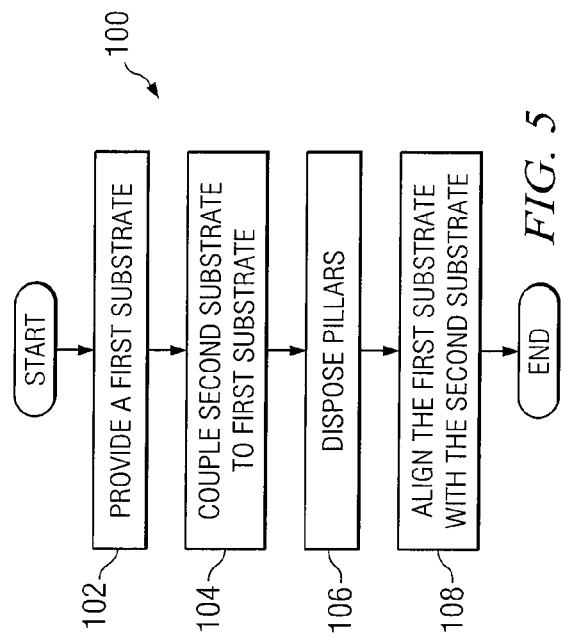
FIG. 5 is a flow diagram illustrating an example method for providing an aligned semiconductor assembly, in accordance with one embodiment of the present invention.

FIG. 5 is a flow diagram illustrating an example method 100 for providing an aligned semiconductor assembly, in accordance with one embodiment of the present invention. The example method begins at step 102 where a first substrate is provided that has a first surface. For example, the first substrate may include a plastic surface mount for a chip (also referred to as a package). As another example, the base substrate may include a semiconductor chip.

At step 104, a second substrate is coupled to and spaced apart from the first substrate. For example, the second substrate may include a semiconductor chip. According to one embodiment, the second substrate has a second surface facing the first surface of the first substrate. In the embodiment, the second substrate includes a set of one or more cavities.

At step 106, a set of one or more non-conductive pillars are disposed on and protrude from the first surface of the first substrate. According to one embodiment, the set of one or more non-conductive pillars are configured and positioned to engage the set of one or more cavities of the second substrate.

At step 108, the second substrate is aligned with the first substrate. According to one embodiment, as the second substrate is coupled to the first substrate, some degree of misalignment may exist. With a coupling force, the set of one or more non-conductive pillars may engage further inside the set of one or more cavities, thereby aligning the second substrate with the first substrate accordingly.

It should be understood that some of the steps illustrated in FIG. 5 may be combined, modified or deleted where appropriate, and additional steps may also be added to the flow diagram. Additionally, as indicated above, steps may be performed in any suitable order without departing from the scope of the invention.

Although the present invention has been described in detail with reference to particular embodiments, it should be understood that various other changes, substitutions, and alterations may be made hereto without departing from the spirit and scope of the present invention. For example, although the present invention has been described with reference to a number of components included within assembly 10, other and different components may be utilized to accommodate particular needs. The present invention contemplates great flexibility in the arrangement of these elements as well as their internal components.

Numerous other changes, substitutions, variations, alterations and modifications may be ascertained by those skilled in the art and it is intended that the present invention encompass all such changes, substitutions, variations, alterations and modifications as falling within the spirit and scope of the appended claims. Moreover, the present invention is not intended to be limited in any way by any statement in the specification that is not otherwise reflected in the claims.

What is claimed is:

1. A method for providing a semiconductor assembly, comprising:
   providing a first substrate, the first substrate having a first surface;
   coupling a second substrate to and spaced apart from the first substrate, the second substrate having a second surface facing the first surface of the first substrate, the second substrate comprising a set of one or more cavities; and
   disposing a set of one or more non-conductive, deformable, polymer pillars on and protruding from the first surface of the first substrate using photolithography, the set of one or more non-conductive pillars being configured and positioned to engage the set of one or more cavities of the second substrate to align the second substrate with the first substrate.

2. The method of claim 1, wherein the first substrate comprises a base substrate and the second substrate comprises a chip.

3. The method of claim 1, wherein the first substrate comprises a chip and the second substrate comprises a base substrate.

4. The method of claim 1, wherein the second substrate is coupled to the first substrate by one or more solder bumps.

5. The method of claim 1, wherein the set of one or more non-conductive pillars have a rectangular cross-section.

6. The method of claim 1, wherein:
   the first substrate has a first coefficient of thermal expansion;
   the second substrate has a second coefficient of thermal expansion; and
   the first coefficient of thermal expansion is different from the second coefficient of thermal expansion.

7. The method of claim 1, wherein the first substrate comprises a plastic surface mount.

8. The method of claim 1, further comprising applying an adhesive to the set of one or more cavities, the adhesive bonding the set of one or more non-conductive pillars to restrict the second substrate and the first substrate from moving apart.

9. The method of claim 1, further comprising coupling a third substrate to and spaced apart from the second substrate, the third substrate having a fourth surface facing a third surface of the second substrate, the third surface of the second substrate being generally parallel to the second surface of the second substrate, the third substrate comprising a second set of one or more cavities; and
   wherein the set of one or more cavities of the second substrate comprises one or more vias, the set of one or more non-conductive pillars extending through the one or more vias of the second substrate and being further configured and positioned to engage the second set of one or more cavities of the third substrate to align the third substrate with the first substrate.

10. The method of claim 1, wherein the set of one or more cavities are tapered downward in order to facilitate engagement with the set of one or more non-conductive pillars.

11. The method of claim 1, wherein the set of one or more non-conductive pillars are bonded to the first substrate.

12. The method of claim 1, wherein the set of one or more non-conductive pillars transmit light to facilitate optical alignment.

* * * * *